United States Patent [19]

Sakakima et al.

[11] Patent Number: 5,691,936

[45] Date of Patent: Nov. 25, 1997

[54] MAGNETORESISTIVE ELEMENT AND MEMORY ELEMENT

[75] Inventors: Hiroshi Sakakima; Takeshi Uenoyama; Yasuhiro Kawawake, all of Kyoto; Yousuke Irie, Osaka, all of Japan

[73] Assignee: Matsushita Electric Industrial Co., Ltd., Osaka, Japan

[21] Appl. No.: 702,382

[22] Filed: Aug. 14, 1996

[30] Foreign Application Priority Data

Aug. 21, 1995 [JP] Japan .................................. 7-212165
Nov. 13, 1995 [JP] Japan .................................. 7-294409

[51] Int. Cl.⁶ ............................................ G11C 11/15
[52] U.S. Cl. ..................... 365/158; 365/171; 360/113
[58] Field of Search .......................... 365/158, 171, 365/173; 360/113, 119

[56] References Cited

U.S. PATENT DOCUMENTS

| 5,173,873 | 12/1992 | Wu | 365/173 |
| 5,422,571 | 6/1995 | Gurney et al. | 324/252 |
| 5,459,687 | 10/1995 | Sakakima | 365/158 |
| 5,465,185 | 11/1995 | Heim et al. | 360/113 |
| 5,587,943 | 12/1996 | Torok | 365/158 |

FOREIGN PATENT DOCUMENTS 6-97531   8/1994   Japan .

OTHER PUBLICATIONS

Baibich, et al., "Giant Magnetoresistance of (001)Fe/(001)Cr Magnetic Superlattices", *Physical Review Letters*, vol. 61, No. 21, Nov. 1988, pp. 2472–2475.

Dieny, et al., "Spin–valve effect in soft ferromagnetic sandwiches", *Journal of Magnetism and Magnetic Materials*, vol. 93, (1991) pp. 101–104.

Irie, et al., "Spin–Valve Memory Elements Using [{Co–Pt/Cu/Ni–Fe–Co}/Cu] Multilayers", *Jpn. J. Appl. Phys.*, vol. 34 (1995) pp. L415–L417.

Parkin, et al., "Oscillations in Exchange Coupling and Magnetoresistance in Metallic Superlattice Structures: Co/Ru, Co/Cr, and Fe/Cr", *Physical Review Letters*, vol. 64, No. 19, May 1990, pp. 2304–2307.

Shinjo, et al., "Large Magnetoresistance of Field–Induced Giant Ferrimagnetic Multilayers", *Journal of the Physical Society of Japan*, vol. 59, No. 9, Sep. 1990, pp. 3061–3064.

Tang, et al., "Spin–Valve RAM Cell", *Intermag*, 95 AP–03.

Primary Examiner—David C. Nelms
Assistant Examiner—Son Mai

[57] ABSTRACT

A magnetoresistive effect element having a large magnetoresistive change with a small magnetic field, and a memory element using the same. A semiconductor film to provide a window for excitation light is arranged on a substrate via a buffer layer. Another semiconductor film and a nonmagnetic metallic film (or a nonmagnetic insulating film) are arranged on the semiconductor film successively. A magnetic film having a square magnetization curve is arranged on the nonmagnetic metallic film (or a nonmagnetic insulating film). An electrode is arranged beneath the substrate and another electrode is arranged on the magnetic film. By radiating a laser light beam to the semiconductor film acting as a window, electrons having spin polarization are excited in the semiconductor film so as to utilize the dependency of the scattering of electrons at the surface of the magnetic film on the magnetization orientation of the magnetic film and the spin polarization state of the excited electrons.

23 Claims, 3 Drawing Sheets

MAGNETORESISTIVE ELEMENT AND MEMORY ELEMENT

BACKGROUND OF THE INVENTION

1. Field of the Invention

The present invention relates to magnetoresistive elements such as magnetic heads and sensors, and memory elements using the same.

2. Disclosure of the Prior Art

It was discovered recently that artificial superlattices (Fe/Cr), (Co/Ru) coupled antiferromagnetically via a metallic nonmagnetic thin film such as Cr and Ru have a giant magnetoresistive effect in a strong magnetic field (1 to 10 kOe) (Physical Review Letter Vol. 61, p2472, 1988; Physical Review Letter Vol. 64 p2304 (1990)). Although these films show a large magnetoresistive effect change, they require a large magnetic field on the order of several kOe and thus they are not practical. The giant magnetoresistive effect was also found in artificial superlattice films (Ni—Fe/Cu/Co) using Co and a magnetic thin film of Ni—Fe having different coercive forces without magnetic coupling, and ones having a magnetoresistive change ratio of about 8% have been obtained in a magnetic field of 0.5 kOe at room temperature (Journal of Physical Society of Japan Vol.59, p3061, 1990). However, the characteristics are not sufficiently practical in this case either, and thus the development of magnetoresistive elements having a larger magnetoresistive change with a smaller applied magnetic field have been called for. As a magnetoresistive element operated by applying a minute magnetic field, a spin valve type element having an antiferromagnetic material Fe—Mn attached to Ni—Fe/Cu/Ni—Fe is proposed (Journal of Magnetism and Magnetic Materials 93, p101, 1991). However, this case has a problem in that the magnetoresistive effect change ratio becomes as small as 2 to 4%.

Furthermore, memory elements using these artificial lattice magnetoresistive effect films are proposed. Examples include ones using two kinds of magnetic layers having different coersive forces (Japanese Journal of Applied Physics, L415–417 1995), and ones using the above mentioned spin valve film (Digest of Intermag '95 AP-03 1995). For these memory elements, ones having a larger magnetoresistive effect change are required in order for the improvement of the readout output.

However, since the above mentioned conventional artificial lattice films use electrons without spin polarization, they have a poor scattering efficiency in the surface of the magnetic film, and thus a theoretical magnetoresistive effect change ratio has not been obtained so far.

SUMMARY OF THE INVENTION

In order to solve the above mentioned problems in the conventional technology, an object of the present invention is to provide a magnetoresistive effect element having a large magnetoresistive change in a weak magnetic field and a memory element having a large output by using electrons with a spin polarization.

In order to achieve the above mentioned object, a magnetoresistive effect element of the present invention comprises a polarizable light source, a semiconductor portion capable of spin polarization of electrons by light excitation using the light source, a magnetic film portion in contact with the semiconductor portion, and electrode portions arranged on the semiconductor portion and the magnetic film portion respectively. Accordingly, the magnetoresistive effect element of the present invention uses only one magnetic film, unlike conventional artificial lattice magnetoresistive effect elements that use at least two magnetic films, and utilizes magnetic scattering of electrons having spin polarization generated by the light excitation in the semiconductor portions, which varies drastically depending upon the magnetization state of the magnetic film at the surface thereof.

In the above mentioned configuration of the magnetoresistive effect element of the present invention, it is preferable that the semiconductor portion comprises two kinds of semiconductors having different lattice constants.

In the above mentioned configuration of the magnetoresistive effect element of the present invention, it is further preferable that a nonmagnetic metallic film is disposed between the magnetic film portion and the semiconductor portion. In this case, it is more preferable that the nonmagnetic metallic film comprises at least one selected from the group consisting of Cu, Ag and Au. In this case, it is further preferable that the nonmagnetic metallic film comprises two kinds of nonmagnetic metallic films. In this case, it is further preferable that, for the two kinds of nonmagnetic metallic film, the film contacting to the semiconductor portion comprises Cs and the other film contacting the magnetic film portion comprises at least one selected from the group consisting of Cu, Ag and Au. In this case, it is more preferable that the film thickness of the nonmagnetic metallic film is 100 nm or less.

In the above mentioned configuration of the magnetoresistive effect element of the present invention, it is more preferable that a nonmagnetic insulation film is provided between the magnetic film portion and the semiconductor portion. Further, in this case, it is preferable that the nonmagnetic insulating film has a crystalline structure similar to that of the semiconductor portion.

In the above mentioned configuration of the magnetoresistive effect element of the present invention, it is further preferable that the magnetic film portion is a ferromagnetic film mainly comprising $Ni_xCo_yFe_z$, with the atomic composition ratio of X=0.6 to 0.9, Y=0 to 0.4, Z=0 to 0.3.

In the above mentioned configuration of the magnetoresistive effect element of the present invention, it is further preferable that the magnetic film portion is a ferromagnetic film mainly comprising $Ni_{x'}Co_{y'}Fe_{z'}$, with the atomic composition ratio of X'=0 to 0.4, Y'=0.2 to 0.95, Z'=0 to 0.5.

A memory element of the present invention comprises a polarizable light source, a semiconductor portion capable of spin polarization of electrons by light excitation using the light source, a magnetic film portion having a square magnetization curve contacting the semiconductor portion, a conductor line portion for reading out information contacting both the semiconductor portion and the magnetic film portion, and a conductor line portion for recording information arranged in the vicinity of the magnetic film portion via a insulating film. Accordingly, the memory element of the present invention uses magnetic film having a magnetic curve with a good squareness, and mainly comprises a conductor line portion for reading out information connected to the magnetic film portion and the semiconductor portion and a conductor line portion for recording information arranged in the vicinity of the magnetic film portion via a insulating film.

In the above mentioned configuration of the memory element of the present invention, it is preferable that the semiconductor portion comprises two kinds of semiconductors having different lattice constants.

In the above mentioned configuration of the memory element of the present invention, it is further preferable that a nonmagnetic metallic film is provided between the magnetic film portion and the semiconductor portion. In this case, it is more preferable that the nonmagnetic metallic film comprises at least one selected from the group consisting of Cu, Ag and Au. In this case, it is further preferable that the nonmagnetic metallic film comprises two kinds of nonmagnetic metallic films. In this case, it is further preferable that, for the two kinds of nonmagnetic metallic film, the film contacting the semiconductor portion comprises Cs and the other film contacting to the magnetic film portion comprises at least one selected from the group consisting of Cu, Ag and Au. In this case, it is more preferable that the film thickness of the nonmagnetic metallic film is 100 nm or less.

In the above mentioned configuration of the memory element of the present invention, it is more preferable that a nonmagnetic insulation film is provided between the magnetic film portion and the semiconductor portion. Further, in this case, it is preferable that the nonmagnetic insulating film has the same crystalline structure as the semiconductor portion.

In the above mentioned configuration of the memory element of the present invention, it is further preferable that the magnetic film portion is a ferromagnetic film mainly comprising $Ni_xCo_yFe_z$, with the atomic composition ratio of $X=0.6$ to $0.9$, $Y=0$ to $0.4$, $Z=0$ to $0.3$.

In the above mentioned configuration of the memory element of the present invention, it is further preferable that the magnetic film portion is a ferromagnetic film mainly comprising $Ni_{x'}Co_{y'}Fe_{z'}$, with the atomic composition ratio of $X'=0$ to $0.4$, $Y'=0.2$ to $0.95$, $Z'=0$ to $0.5$.

In the above mentioned configuration of the memory element of the present invention, it is more preferable that the conductor line portion for recording information comprises two kinds of conductor lines orthogonal to each other in the vicinity of the magnetic film portion.

According to the above mentioned preferable configuration of the magnetoresistive effect element of the present invention comprising a polarizable light source, a semiconductor portion capable of spin polarization of electrons by light excitation using the light source, a magnetic film portion, and electrode portions arranged in the semiconductor portion and the magnetic film portion respectively, the below mentioned advantages can be achieved. That is, electrons having spin polarization generated in the semiconductor portion using a polarizable light source such as a semiconductor laser flow toward the magnetic film electrode 7 to scatter magnetically at the surface of the magnetic film portion being applied with a electric field to both the electrode portions located on the semiconductor portion and the magnetic film portion respectively. At this time, the scattering ratio of the electrons having spin polarization varies drastically depending upon the magnetization state of the magnetic film portion. Therefore, by changing the spin of the excited electrons from the up state to the down state, the magnetization state of the magnetic film is changed by the magnetic field applied to the magnetic film portion, and this change is detected using the change in the scattering ratio of the polarized electrons at the surface of the magnetic film. Accordingly, the change in magnetoresistance allows detection of changes in the magnetic field.

In the above mentioned preferable configuration of the magnetoresistive effect element of the present invention, since the semiconductor portion comprises two kinds of semiconductors having different lattice constants, the degeneration of the band is further released owing to the stress therefrom, and electrons having a larger polarization ratio can be excited by light.

In the above mentioned preferable configuration of the magnetoresistive effect element of the present invention, since a nonmagnetic metallic film is provided between the magnetic film portion and the semiconductor portion, the reaction at the surface of the magnetic film portion and the semiconductor portion is prevented and thus a good surface can be obtained. Accordingly, by having the good surface, the magnetic scattering of electrons at the surface can be facilitated. Further, in this case, according to the preferable embodiment that the nonmagnetic metallic film comprises at least one selected from the group consisting of Cu, Ag and Au, a smooth and clear surface can be obtained easily between the magnetic film portion and the nonmagnetic metallic film. In particular, by using Cu for the nonmagnetic metallic film, a large magnetoresistive change ratio can be realized. Further in this case, according to the preferable embodiment that the nonmagnetic metallic film comprises two kinds of nonmagnetic metallic films, electrons can be moved smoothly from the semiconductor portion to the magnetic film portion. In this case, according to the further preferable embodiment that, for the two kinds of nonmagnetic metallic films, the film contacting the semiconductor portion comprises Cs and the other film contacting the magnetic film portion comprises at least one selected from the group consisting of Cu, Ag and Au, electrons can be moved smoothly from the semiconductor portion to the magnetic film portion. Moreover in this case, according to the preferable embodiment that the film thickness of the nonmagnetic metallic film is 100 nm or less, memory of the spin state is not lost from the electrons.

In the above mentioned preferable configuration of the magnetoresistive effect element of the present invention, since a nonmagnetic insulation film is provided between the magnetic film portion and the semiconductor portion, the reaction at the surface of the magnetic film portion and the semiconductor portion is prevented and thus a good surface can be obtained. Further, by having the good surface, the magnetic scattering of electrons at the surface can be facilitated. Moreover, in this case, according to the further preferable embodiment that the nonmagnetic insulating film has the same crystalline structure as the semiconductor portion, the epitaxial growth of the nonmagnetic insulating film on the semiconductor portion is possible, and thus electron tunneling can be utilized efficiently. Such a nonmagnetic insulating film can be obtained by widening the band gap by slightly changing the composition of the semiconductor portion.

In the above mentioned preferable configuration of the magnetoresistive effect element of the present invention, since the magnetic film portion is a ferromagnetic film mainly comprising $Ni_xCo_yFe_z$, with the composition ratio of $X=0.6$ to $0.9$, $Y=0$ to $0.4$, $Z=0$ to $0.3$, the magnetoresistive change easily occurs and thus a magnetic film portion that can easily reverse the magnetization in a weak magnetic field can be obtained.

In the above mentioned preferable configuration of the magnetoresistive effect element of the present invention, since the magnetic film portion is a ferromagnetic film mainly comprising $Ni_{x'}Co_{y'}Fe_{z'}$, with the composition ratio of $X'=0$ to $0.4$, $Y'=0.2$ to $0.95$, $Z'=0$ to $0.5$, a further large magneoresistive change ratio can be realized.

According to the above mentioned preferable configuration of the memory element of the present invention comprising a polarizable light source, a semiconductor portion capable of spin polarization of electrons by light excitation using the light source, a magnetic film portion having a square magnetization curve contacting the semiconductor portion, a conductor line portion for reading out information contacting to both the semiconductor portion and the magnetic film portion, and a conductor line portion for recording information arranged in the vicinity of the magnetic film portion via an insulating film, the below mentioned advantages can be achieved. That is, by applying electric current to the conductor line portion for recording information to generate a magnetic field larger than the coercive force of the magnetic film portion and magnetize the magnetic film portion, information can be recorded on the magnetic film portion. When the squareness of the magnetization curve of the magnetic film portion is good, the reversal of magnetization does not occur in a magnetic field weaker than the coercive force, and thus the recorded information can be maintained. Furthermore, by generating electrons with spin polarization in either the up state or the down state by light excitation in the semiconductor portion and utilizing the difference of the resistance between the electrodes arranged on the semiconductor portion and the magnetic film portion according to the magnetization state of the magnetic film portion on which the information is recorded, the information can be read out. Further, by inputting a changing minute current to the conductor line portion for recording information and utilizing the magnetic field generated thereby for changing the magnetization state of the magnetic film portion and arranging the output portion to connect the load to either the semiconductor portion or the magnetic film portion, the memory element can function also as an amplifying element. However, in order to obtain an amplifying element with a good linearity, it is preferable to have the orientation of the magnetic field generated by the conductor line portion for recording information the same as the difficult axis orientation of the magnetic film portion.

In the above mentioned preferable configuration of the memory element of the present invention, since the conductor line portion for recording information comprises two kinds of conductor lines orthogonal to each other in the vicinity of the magnetic film portion, a memory element having many bits can be obtained.

DETAILED DESCRIPTION OF THE PREFERRED EMBODIMENTS

The present invention will be further described with reference to examples.

Figure 1:
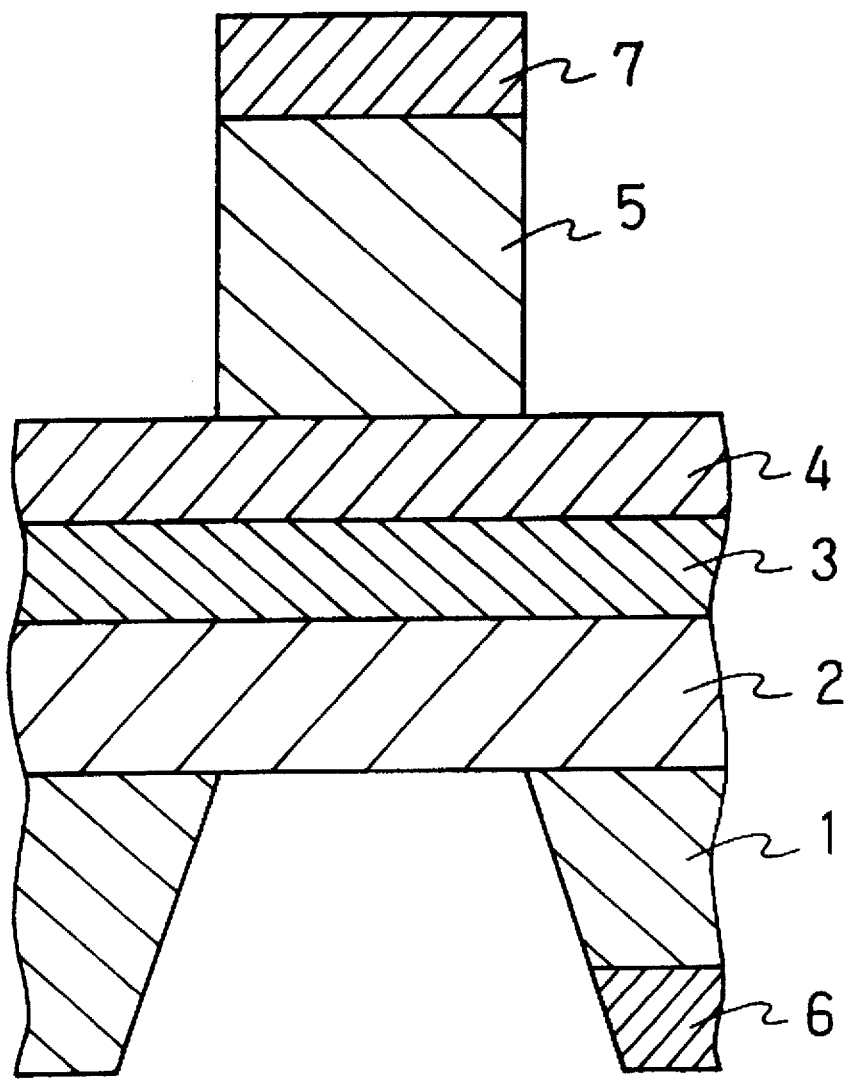
FIG. 1 is a cross sectional diagram illustrating an embodiment of the magnetoresistive effect elements of the present invention.

FIG. 1 is a cross sectional diagram illustrating an embodiment of the magnetoresistive effect elements of the present invention. As shown in FIG. 1, a semiconductor film 2 which provides a window for excitation light is arranged on a substrate 1 via a buffer layer. The buffer layer herein is for maintaining a good surface to form a good film. A semiconductor film 3 and a nonmagnetic metallic film (or a nonmagnetic insulating film) 4 are arranged successively on the semiconductor film 2. A magnetic film 5 having a magnetization curve with a good squareness is arranged on the nonmagnetic metallic film (or a nonmagnetic insulating film) 4. An electrode 6 is arranged beneath the substrate 1, and an electrode 7 is arranged on the magnetic film 5. Laser light passes through the semiconductor film 2 as a window and illuminates the semiconductor film 3 arranged on the semiconductor film 2. By this, electrons with spin polarization are excited by light in the semiconductor film 3. By applying an electric field to the electrodes 6, 7 arranged on the substrate 1 side and the magnetic film 5 side respectively, the spin polarized electrons flow from the semiconductor film 3 to the magnetic film 5 through the nonmagnetic metallic film (or the nonmagnetic insulating film) arranged therebetween and have a magnetic scattering at the surface of the magnetic film 5. At this time, the scattering ratio of the spin polarized electrons varies according to the magnetization state of the magnetic film 5. Accordingly, by having the spin of the excited electrons in the up state or the down state, the magnetization state of the magnetic film 5 changes according to the magnetic field applied to the magnetic film 5 to be detected, and the scattering ratio of the polarized electrons at the surface of the magnetic film 5 changes. Since the magnetoresistive change occurs between the electrodes 6, 7 arranged on the substrate 1 and the magnetic film 5, the magnetic field change can be detected. In some cases, the nonmagnetic metallic film (or the nonmagnetic insulating film) 4 needs not be comprised. When it is used as a magnetoresistive effect element accordingly, the element can be operated by changing the magnetization state of the magnetic film 5 by the external magnetic field.

Figure 2:
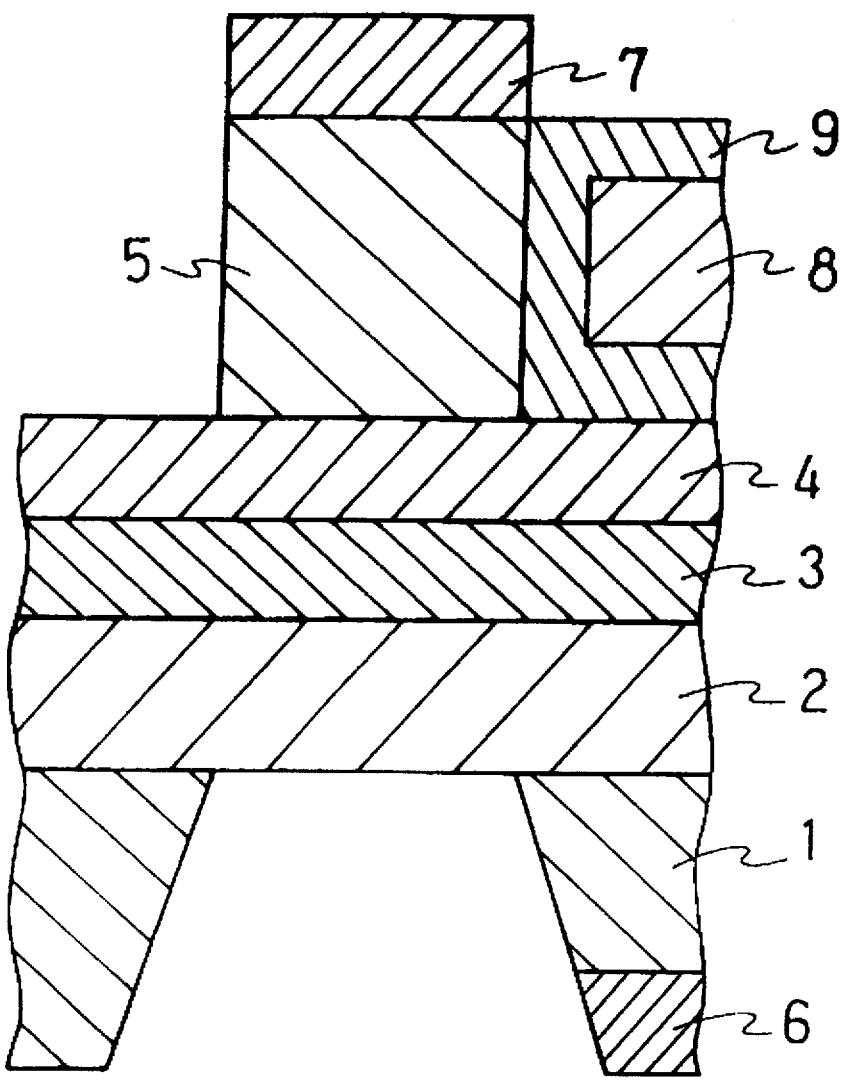
FIG. 2 is a cross sectional diagram illustrating an embodiment of the memory elements of the present invention.

FIG. 2 is a cross sectional diagram illustrating an embodiment of the memory elements of the present invention. As shown in FIG. 2, A conductor line 8 for recording information is arranged in the vicinity of the magnetic film 5 via an electric insulating portion 9. Since the other parts of the configuration are the same as in the above mentioned magnetoresistive effect element illustrated in FIG. 1, the same members bear the same numerals and further explanation is not provided herein. In this case, a conductor line portion for reading out information is formed by the path extending from the electrode 6 to the electrode 7. When it is used as a memory element, by applying current to the conductor line 8 arranged in the vicinity of the magnetic film 5 to generate a magnetic field larger than the coercive force of the magnetic film 5, the magnetic film 5 is magnetized to a certain orientation. By this operation, information is recorded on the magnetic film 5. When the magnetic film 5 has a magnetization curve with a good squareness, its magnetization is not reversed by a magnetic field smaller than the coercive force and thus the recorded information can be maintained. Further, by the light excitation, it is also possible to generate electrons having spin polarization only to the up state to read out the information according to whether the electrons are easily scattered or not (that is, whether the resistance is high or low) at the surface of the magnetic film 5 depending upon the magnetization orientation of the magnetic film 5 on which the information is recorded.

Figure 3:
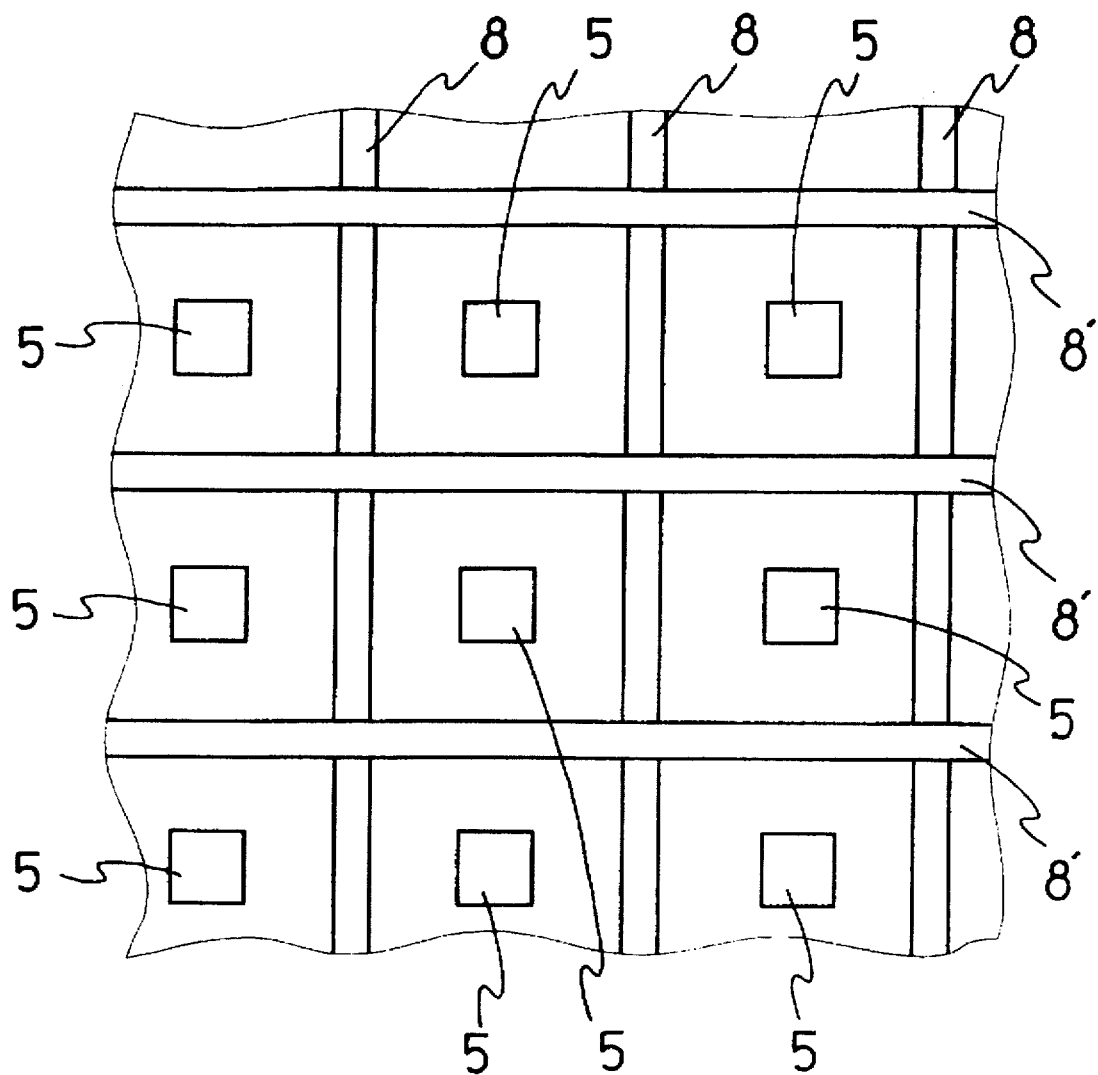
FIG. 3 is a plan view illustrating an embodiment of the memory elements of the present invention having many bits.

When a memory element having many bits is formed, as illustrated in FIG. 3, the elements (magnetic film 5) are arranged in a matrix-like manner and arrange conductor lines 8, 8' in a lattice-like manner across the elements. In order to insulate the elements, an insulating portion can be formed by injecting ions of B (boron), H (hydrogen) and O (oxygen) or by cutting the semiconductor film portion by milling or etching.

By radiating a light such as a semiconductor laser as the light source to the semiconductor film 3 with a wavelength corresponding to the band gap of the semiconductor film 3, electrons having spin polarization are generated by light excitation. At the time, according to the difference of the probabilities whether the excited electrons assume the up spin (+½) state or the down spin (−½) state, electrons having spin polarization can be obtained. For example, in the case of GaAs, the P band of the Γ point has $P_{3/2}$ degenerated four times and $P_{1/2}$ degenerated twice, and by radiating a polarized laser light beam, electrons having 50% polarization ratio can be excited in the conducting sleeve. Further, if another GaAs film having a different lattice constant is formed on the GaAs P film and used as the semiconductor film 3, the band degeneration can be further released by the stress therefrom, and electrons having a larger polarization ratio can be excited by light.

As the magnetic film, Ni-rich magnetic films, which can easily generate magnetoresistive change and can reverse the magnetization in a weak magnetic field, mainly comprising $Ni_xCo_yFe_z$, with the atomic composition ratio of X=0.6 to 0.9, Y=0 to 0.4, Z=0 to 0.3 are preferable. Examples of the Ni-rich magnetic films include $Ni_{0.8}Co_{0.15}Fe_{0.05}$ and $Ni_{0.68}Co_{0.2}Fe_{0.12}$. Further, as ones having a larger magnetoresistive change, though the operation magnetic field becomes slightly larger, Co-rich magnetic films mainly comprising $Ni_{x'}Co_{y'}Fe_{z'}$, with the atomic composition ratio of X'=0 to 0.4, Y'=0.2 to 0.95, Z'=0 to 0.5 can be used. Examples of the Co-rich magnetic films include $Co_{0.9}Fe_{0.1}$ and $Co_{0.7}Ni_{0.1}Fe_{0.2}$.

As to the ratio of $Ni_{x'}Co_{y'}Fe_{z'}$, 50 weight % or more is preferable. And in order to improve soft magnetic characteristics, corrosion resistance and wearing resistance, it is effective to add materials such as Ti, Zr, Hf, Nb, Ta, Cr, Mo, W and Ru as needed.

If the magnetic film 5 is formed directly on the semiconductor film 3, problems may occur in some cases, such as occurrence of a reaction, and failure to obtain a smooth surface suitable for obtaining a large magnetoresistive change ratio. In these cases, it is preferable to insert a nonmagnetic metallic film (or a nonmagnetic insulating film prepared in consideration of the tunnel effect) 4 between the surfaces of the semiconductor film 3 and the magnetic film 5 as mentioned above.

A nonmagnetic metallic film which has little reaction at the surface of the magnetic film and has little tendency to form a solid solution is preferable. The nonmagnetic metallic film, is preferably at least one selected from the group consisting of Cu, Ag and Au since they provide a smooth and clear surface between the magnetic film and the nonmagnetic film easily. Cu is further preferable to obtain a particularly large magnetoresistive change ratio. Since the memory of the spin state is lost from the electrons if the film thickness of the nonmagnetic metallic film is larger than 100 nm, it is preferable to have the thickness of the nonmagnetic metallic film be 100 nm or less.

In order to facilitate the transfer of electrons from the semiconductor film 3 to the magnetic film 5, it is effective to form a nonmagnetic metallic film such as Cs at the semiconductor film side. Therefore, a configuration to form a nonmagnetic metallic film such as Cs at the semiconductor film 3 side and a nonmagnetic metallic film such as Cu at the side to contact with the magnetic film 5 can be also used.

In the case of inserting the nonmagnetic insulating film, the film thickness should be at most 10 nm in order to permit carrier tunneling through the film. Furthermore, as the nonmagnetic insulating film composition, a film that has almost the same composition as the semiconductor film 5 and also has the band gap behaving as the insulating film is preferable.

This invention will be described in further details with reference to examples.

(EXAMPLE 1)

Using molecular beam epitaxy (MBE), an AlGaAs film for a window having a thickness of approximately 10 nm was formed for generating electrons having spin polarization with a thickness of approximately 1 µm on a GaAs substrate via a GaAs film buffer layer. A GaAs film having a thickness of approximately 50 nm was formed on the AlGaAs film for generating electrons having spin polarization. Further, a Cu film having a thickness of approximately 5 nm and an $Ni_{0.7}Co_{0.2}Fe_{0.12}$ magnetic film having a thickness of approximately 5 nm were formed on the GaAs film and electrodes were arranged at the substrate side and the magnetic film side to obtain a magnetoresistive effect element.

magnetic field of approximately 20 Oe was applied to the element to the orientation approximately parallel to the orientation of the incident laser beam while radiating a semiconductor laser light having a wavelength of 830 nm polarized to a certain orientation so as to reverse the magnetization orientation. In the measurement of the magnetoresistive change of the element by applying voltage to the electrodes, an approximately 30% magnetoresistive change ratio was obtained.

(EXAMPLE 2)

As in example 1, using MBE, a $GaAs_{0.75}P_{0.25}$ film for a window of approximately 2 µm thickness was formed on the GaAs substrate via a GaAs film buffer layer having a thickness of approximately 10 nm. And a GaAs film having a thickness of approximately 100 nm was formed thereon for generating electrons having spin polarization. Further, a Cu film having a thickness of approximately 10 nm and a $Co_{0.7}Fe_{0.2}Ni_{0.1}$ magnetic film having a thickness of approximately 5 nm were formed on the GaAs film and electrodes were arranged at the substrate side and the magnetic film side to obtain a magnetoresitive effect element.

A magnetic field of approximately 50 Oe was applied to the element to the orientation approximately parallel to the orientation of the incident laser beam while radiating a semiconductor laser light having a wavelength of 830 nm polarized to a certain orientation so as to reverse the magnetization orientation. In the measurement of the magnetoresistive change of the element by applying voltage to the electrodes, an approximately 50% magnetoresistive change ratio was obtained.

(EXAMPLE 3)

As in the above mentioned Example 1, a $GaAs_{0.75}P_{0.25}$ film for a window having a thickness of approximately 2 µm was formed by MBE on a GaAs substrate via a GaAs film buffer layer having a thickness of approximately 10 nm. And a GaAs film having a thickness of approximately 100 nm was formed thereon for generating electrons having spin polarization. Further, an $Al_{0.3}Ga_{0.7}As$ insulating film having a thickness of approximately 5 nm and a $Co_{0.7}Fe_{0.2}Ni_{0.1}$ magnetic film having a thickness of approximately 5 nm were formed on the GaAs film and electrodes were arranged at the substrate side and the magnetic film side to obtain a magnetoresitive effect element.

A magnetic field of approximately 50 Oe was applied to the element to the orientation approximately parallel to the orientation of the incident laser beam while radiating a semiconductor laser light having a wavelength of 830 nm polarized to a certain orientation so as to reverse the magnetization orientation. In the measurement of the magnetoresistive change of the element by applying voltage to the electrodes, an approximately 70% magnetoresistive change ratio was obtained.

(EXAMPLE 4)

As in the above mentioned Example 1, a AlGaAs film for a window having a thickness of approximately 1 μm was formed by MBE on a GaAs substrate via a GaAs film buffer layer having a thickness of approximately 10 nm. And a GaAs film having a thickness of approximately 50 nm was formed thereon for generating electrons having spin polarization. Further, a Cu film having a thickness of approximately 5 nm and an $Ni_{0.7}Co_{0.2}Fe_{0.12}$ magnetic film having a thickness of approximately 5 nm were formed on the GaAs film and electrodes were provided at the substrate side and the magnetic film side. Furthermore, an Au conductor line was formed in the vicinity of the magnetic film via an insulating film to obtain a magnetoresitive effect element having 1 bit.

After magnetizing the magnetic film of this element to a certain orientation by flowing a current in the Au conductor line, a voltage was applied to the element for measuring the magnetoresistive change of the element while radiating a semiconductor laser light having a wavelength of 830 nm polarized to a certain orientation. It was found that a large magnetoresistive change may or may not occur according to the magnetization direction of the magnetic film. This proves that the element can function as a memory element.

As heretofore mentioned, the present invention realizes a magnetoresistive effect element and a solid memory element having a large magnetoresistive change with a small magnetic field.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A magnetoresistive element comprising a polarizable light source, a semiconductor portion capable of spin polarization of electrons by light excitation using the light source, a magnetic film portion, and electrode portions arranged on the semiconductor portion and the magnetic film portion respectively.

2. The magnetoresistive element according to claim 1, wherein the semiconductor portion comprises two kinds of semiconductors having different lattice constants.

3. The magnetoresistive element according to claim 1, wherein a nonmagnetic metallic film is provided between the magnetic film portion and the semiconductor portion.

4. The magnetoresistive element according to claim 3, wherein the nonmagnetic metallic film comprises at least one selected from the group consisting of Cu, Ag and Au.

5. The magnetoresistive element according to claim 3, wherein the nonmagnetic metallic film comprises two kinds of nonmagnetic metallic films.

6. The magnetoresistive element according to claim 5, wherein, for the two kinds of nonmagnetic metallic film, the film contacting the semiconductor portion comprises Cs and the other film contacting the magnetic film portion comprises at least one selected from the group consisting of Cu, Ag and Au.

7. The magnetoresistive element according to claim 3, wherein the film thickness of the nonmagnetic metallic film is 100 nm or less.

8. The magnetoresistive element according to claim 1, wherein a nonmagnetic insulation film is provided between the magnetic film portion and the semiconductor portion.

9. The magnetoresistive element according to claim 8, wherein the nonmagnetic insulating film has the same crystalline structure as the semiconductor portion.

10. The magnetoresistive element according to claim 1, wherein the magnetic film portion is a ferromagnetic film mainly comprising $Ni_xCo_yFe_z$, with the atomic composition ratio of X=0.6 to 0.9, Y=0 to 0.4, Z=0 to 0.3.

11. The magnetoresistive element according to claim 1, wherein the magnetic film portion is a ferromagnetic film mainly comprising $Ni_{x'}Co_{y'}Fe_{z'}$, with the atomic composition ratio of X'=0 to 0.4, Y'=0.2 to 0.95, Z'=0 to 0.5.

12. A memory element comprising a polarizable light source, a semiconductor portion capable of spin polarization of electrons by light excitation using the light source, a magnetic film portion having a square magnetization curve contacting to the semiconductor portion, a conductor line portion for reading out information contacting both to the semiconductor portion and the magnetic film portion, and a conductor line portion for recording information arranged in the vicinity of the magnetic film portion via an insulating film.

13. The memory element according to claim 12, wherein the semiconductor portion comprises two kinds of semiconductors having different lattice constants.

14. The memory element according to claim 12, wherein a nonmagnetic metallic film is provided between the magnetic film portion and the semiconductor portion.

15. The memory element according to claim 14, wherein the nonmagnetic metallic film comprises at least one selected from the group consisting of Cu, Ag and Au.

16. The memory element according to claim 14, wherein the nonmagnetic metallic film comprises two kinds of nonmagnetic metallic films.

17. The memory element according to claim 16, wherein, for the two kinds of nonmagnetic metallic film, the film contacting the semiconductor portion comprises Cs and the other film contacting the magnetic film portion comprises at least one selected from the group consisting of Cu, Ag and Au.

18. The memory element according to claim 14, wherein the film thickness of the nonmagnetic metallic film is 100 nm or less.

19. The memory element according to claim 12, wherein a nonmagnetic insulation film is provided between the magnetic film portion and the semiconductor portion.

20. The memory element according to claim 19, wherein the nonmagnetic insulating film has the same crystalline structure as the semiconductor portion.

21. The memory element according to claim 12, wherein the magnetic film portion is a ferromagnetic film mainly comprising $Ni_xCo_yFe_z$, with the atomic composition ratio of X=0.6 to 0.9, Y=0 to 0.4, Z=0 to 0.3.

22. The memory element according to claim 12, wherein the magnetic film portion is a ferromagnetic film mainly comprising $Ni_{x'}Co_{y'}Fe_{z'}$, with the atomic composition ratio of X'=0 to 0.4, Y'=0.2 to 0.95, Z'=0 to 0.5.

23. The memory element according to claim 12, wherein the conductor line portion for recording information comprises two kinds of conductor lines orthogonal to each other in the vicinity of the magnetic film portion.

* * * * *